(12) United States Patent
Kim

(10) Patent No.: US 10,270,064 B2
(45) Date of Patent: Apr. 23, 2019

(54) WINDOW FOR REDUCING VISIBILITY OF AN END PORTION OF A POLARIZER, AND DISPLAY DEVICE COMPRISING THE SAME

(71) Applicant: SAMSUNG DISPLAY CO., LTD., Yongin-si, Gyeonggi-do (KR)

(72) Inventor: Hyunchul Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 56 days.

(21) Appl. No.: 14/938,766

(22) Filed: Nov. 11, 2015

(65) Prior Publication Data

US 2016/0293895 A1 Oct. 6, 2016

(30) Foreign Application Priority Data

Apr. 3, 2015 (KR) .................. 10-2015-0047502

(51) Int. Cl.
| | |
|---|---|
| *H01L 51/52* | (2006.01) |
| *H01L 29/08* | (2006.01) |
| *H01L 35/24* | (2006.01) |
| *H01L 51/00* | (2006.01) |

(52) U.S. Cl.
CPC ........ *H01L 51/5281* (2013.01); *H01L 51/525* (2013.01)

(58) Field of Classification Search
CPC ............. H01L 51/5281; H01L 51/525; H01L 27/32–27/3297; H01L 2227/32–2227/326; H01L 27/28; H01L 2251/10–2251/105; H01L 2251/50–2251/568; G06F 3/0412

USPC ................ 257/40; 438/99; 345/173; 313/511
See application file for complete search history.

(56) References Cited

U.S. PATENT DOCUMENTS

| | | | | |
|---|---|---|---|---|
| 2009/0086123 | A1* | 4/2009 | Tsuji | G02F 1/133308 349/58 |
| 2009/0237602 | A1* | 9/2009 | Kubota | G02F 1/1335 349/122 |
| 2009/0244834 | A1* | 10/2009 | Sugimori | H04M 1/22 361/679.55 |
| 2010/0232162 | A1* | 9/2010 | Shin | H01L 27/322 362/293 |
| 2012/0075838 | A1* | 3/2012 | Lee | G02F 1/133308 362/97.1 |
| 2012/0200796 | A1* | 8/2012 | Harayama | G02F 1/133308 349/43 |
| 2013/0034685 | A1 | 2/2013 | An et al. | |
| 2014/0168090 | A1* | 6/2014 | Aaltonen | G06F 1/1601 345/173 |
| 2014/0335316 | A1* | 11/2014 | Fukushima | B32B 7/12 428/161 |

(Continued)

FOREIGN PATENT DOCUMENTS

| | | |
|---|---|---|
| KR | 10-2012-0045491 A | 5/2012 |
| KR | 10-2013-0015230 A | 2/2013 |

(Continued)

*Primary Examiner* — Nduka E Ojeh
(74) *Attorney, Agent, or Firm* — Lewis Roca Rothgerber Christie LLP

(57) ABSTRACT

A display device includes a display panel, a polarizer on the display panel, an adhesion layer on the polarizer, and a window on the adhesion layer, the window including a light transmissive window base, a light shielding layer on the window base and a protrusion on the light shielding layer.

11 Claims, 7 Drawing Sheets

(56) References Cited

U.S. PATENT DOCUMENTS

2014/0340609 A1* 11/2014 Taylor ............... G02F 1/133308
349/58
2015/0324045 A1* 11/2015 Chi ........................ G06F 3/041
345/173

FOREIGN PATENT DOCUMENTS

KR    10-2014-0064146 A    5/2014
KR    10-2014-0102946 A    8/2014

* cited by examiner

WINDOW FOR REDUCING VISIBILITY OF AN END PORTION OF A POLARIZER, AND DISPLAY DEVICE COMPRISING THE SAME

CROSS-REFERENCE TO RELATED APPLICATION

This application claims priority to and the benefit of Korean Patent Application No. 10-2015-0047502, filed on Apr. 3, 2015, with the Korean Intellectual Property Office, the disclosure of which is incorporated herein in its entirety by reference.

BACKGROUND

1. Field

The described embodiments relate to a window, and a display device comprising the window.

2. Description of the Related Art

Recently, display devices, which may display images using a liquid crystal display ("LCD") panel, a plasma display panel ("PDP"), an electro luminescence display ("ELD") panel, or an organic light emitting display ("OLED") panel, have drawn attention. Such display devices may be manufactured to have a flat screen, or to have a curved screen.

Display devices that include various electrodes and wirings may reflect externally incident ambient light, and may exhibit a low contrast ratio while under ambient light conditions, causing visibility of an image displayed on the display devices to potentially be diminished. To reduce or prevent reflection of ambient light, a polarizer may be located on a display panel.

In general, the polarizer is located below a window of the display device. A boundary portion of the polarizer may be located below a light shielding portion of the window to prevent visibility of a boundary surface of the polarizer.

It is to be understood that this background of the technology section is intended to provide useful background for understanding the technology and as such disclosed herein, the technology background section may include ideas, concepts or recognitions that were not part of what is known or appreciated by those skilled in the pertinent art prior to a corresponding effective filing date of subject matter disclosed herein.

SUMMARY

The present disclosure is directed to a display device capable of reducing or preventing visibility of an end portion of a polarizer attached to a display panel.

Further, the present disclosure is directed to a window used in the display device.

According to an embodiment of the present invention, a display device includes a display panel, a polarizer on the display panel, an adhesion layer on the polarizer, and a window on the adhesion layer, the window including a light transmissive window base, a light shielding layer on the window base and a protrusion on the light shielding layer.

The light shielding layer may be on a surface of the window base facing the display panel.

The protrusion may extend toward the polarizer.

The protrusion may have a height in a range of about 10 µm to about 200 µm.

The protrusion may be spaced from the polarizer.

A distance between the protrusion and the polarizer may be in a range of about 10 µm to about 200 µm.

The protrusion may have a polygonal, a circular, a semi-circular, an elliptical, or a semi-elliptical cross-section.

The window base may have a curved edge portion, the light shielding layer may be on the curved edge portion, and the protrusion may extend along the curved edge portion.

The display panel may include a first substrate, a first electrode on the first substrate, an organic light emitting layer on the first electrode, and a second electrode on the organic light emitting layer.

The display panel may include a second substrate on the second electrode.

The display panel may include a thin film encapsulation layer on the second electrode.

According to another embodiment of the present invention, a window for a display device includes a light transmissive window base, a light shielding layer on the window base, and a protrusion on the light shielding layer.

The protrusion may have a height in a range of about 10 µm to about 100 µm.

The protrusion may have a polygonal, a circular, a semi-circular, an elliptical, or a semi-elliptical cross-section.

The window may have a curved edge portion, and the light shielding layer may be located on the curved edge portion.

According to embodiments of the present invention, visibility of an end portion of a polarizer located on a display panel may be reduced or prevented. Accordingly, the display device according to embodiments of the present invention may improve a visual rating by a user.

The foregoing is illustrative only, and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure will be more clearly understood from the following detailed description taken in conjunction with the accompanying drawings, in which.

DETAILED DESCRIPTION

Figure 1:
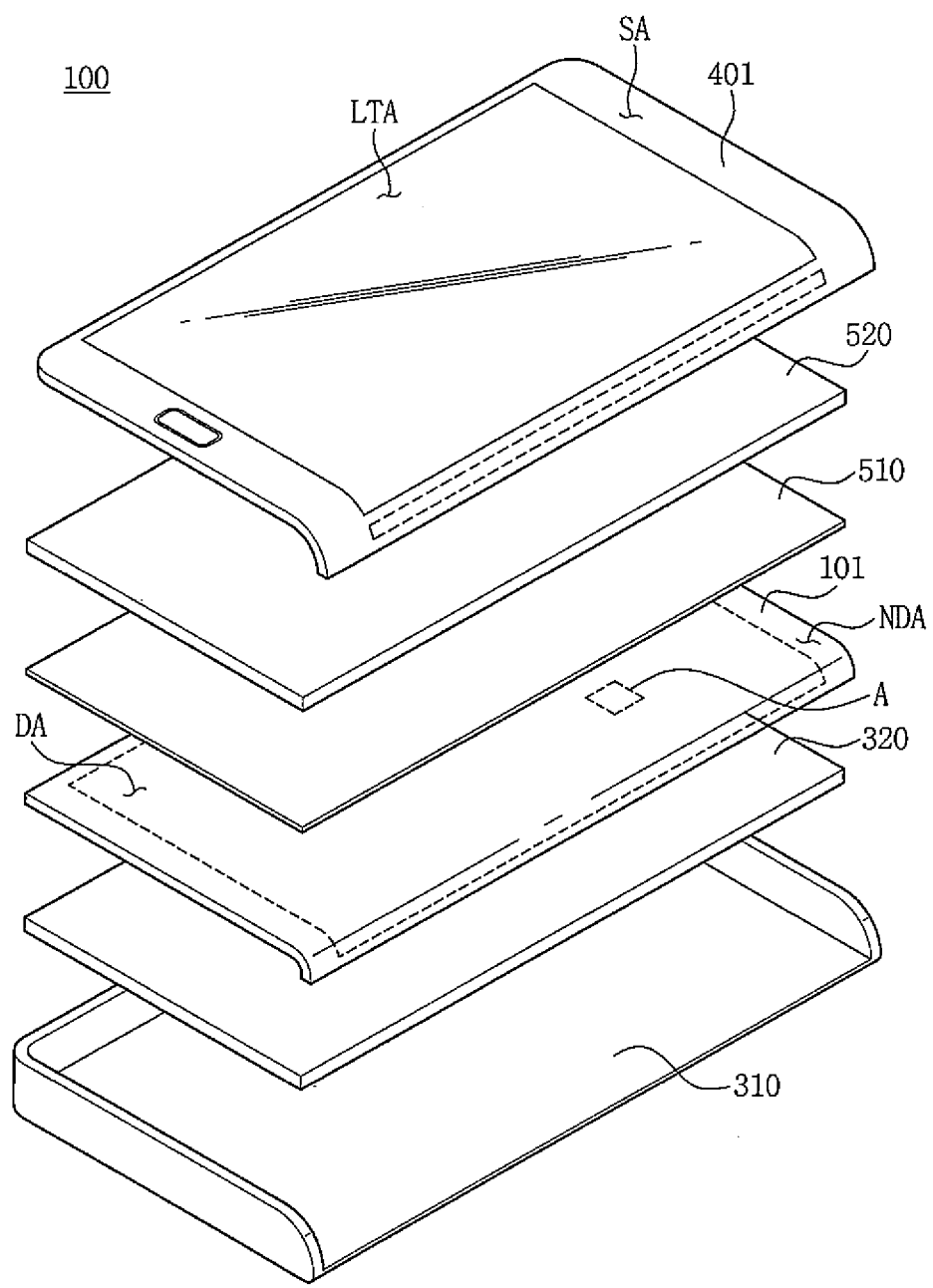
FIG. 1 is an exploded perspective view illustrating a display device according to a first exemplary embodiment.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a first exemplary embodiment of the present invention will be described with reference to FIGS. 1 through 3.

FIG. 1 is an exploded perspective view illustrating a display device 100 according to a first exemplary embodiment.

The display device 100 according to the first exemplary embodiment may include a display panel 101, a housing 310 configured to accommodate the display panel 101, a shock absorbing sheet 320 located between the display panel 101 and the housing 310, a polarizer 510 located on the display panel 101, a window 401 located on the polarizer 510, and an adhesive layer 520 located between the polarizer 510 and the window 401.

The display panel 101 may display an image. The type of the display panel 101 is not particularly limited. For example, the display panel 101 may include a self-emission type display panel, such as an organic light emitting display panel, or may include a non-emission type display panel, such as a liquid crystal display ("LCD") panel, an electrowetting display panel, an electrophoretic display panel, or a microelectromechanical system ("MEMS") display panel. When the non-emission type display panel is applied, the display device 100 may include a backlight unit configured to provide light to the display panel 101.

According to the first exemplary embodiment, an organic light emitting display panel is used as the display panel 101. The display panel 101 may have a display area DA in which an image may be displayed, and a non-display area NDA in which an image may not be displayed. Referring to FIG. 1, the non-display area NDA may surround the display area DA.

The housing 310 may accommodate the display panel 101. In FIG. 1, the housing 310, which is composed of a single unit having a space for accommodating the display panel 101, is illustrated by way of example. However, the housing 310 of other embodiments may have a structure in which two or more units are coupled to each other.

The housing 310 may further accommodate, in addition to the display panel 101, a circuit board on which a driver element is mounted, or may further accommodate a power unit, such as a battery.

The shock absorbing sheet 320 may be located between the display panel 101 and the housing 310 to absorb shock that may be inflicted to the display panel 101 (e.g., by dropping the display device 100). Accordingly, the shock absorbing sheet 320 may prevent an external shock from being directly inflicted to the display panel 101. However, it should be noted that the shock absorbing sheet 320 may be omitted.

The window 401 may be located on a display side of the display panel 101 (e.g., above a side of the display panel 101 toward which an image is displayed), and may be coupled to the housing 310 to form an exterior surface of the display device 100, along with the housing 310.

The polarizer 510 may be located on the display panel 101. Further, an adhesive layer may be located between the polarizer 510 and the display panel 101 to allow the polarizer 510 to be attached to the display panel 101.

The polarizer 510 may reduce or prevent externally incident light (external light) from being reflected off the display panel 101 and from being perceived by a user. Through the use of the polarizer 510, deterioration in display performance of the display device 100 may be reduced or prevented, and the visibility of display images perceived by the user may be improved.

The polarizer 510 may include a linear polarizer and a phase retardation layer.

The linear polarizer is configured to linearly polarize light that is incident onto the polarizer 510. Examples of the linear polarizer may include a polyvinyl alcohol (PVA)-based resin film including absorption-oriented dichroic dyes.

The phase retardation layer is configured to retard a phase of light. The phase retardation layer is configured to convert linear polarization into circular polarization, and to convert circular polarization into linear polarization. For example, external light incident onto the polarizer 510 may be converted into linearly-polarized light by the linear polarizer, and may be converted into circularly-polarized light by the phase retardation layer. The circularly-polarized external light may be reflected within the display panel 101 to become a reflected light (e.g., to become reflected light), and during the reflection process, a phase and a polarization axis of the reflected light may be changed from those of the circularly-polarized external light. The reflected light, which has a changed phase and changed polarization axis, might not pass through the polarizer 510, thus bringing about an effect of reducing or preventing the external light reflection using the polarizer 510.

The adhesive layer 520 may be provided between the polarizer 510 and the window 401 to allow the display panel 101 and the window 401 to be firmly coupled to each other.

To prevent the adhesive layer 520 from decreasing luminance of light emitted from the display panel 101, the adhesive layer 520 may include an optically clear adhesive OCA. The adhesive layer 520 may be formed of a transparent polymer resin, which may have an adhesion property, and which may be cured by light or heat. For example, the adhesive layer 520 may be made of a photocurable resin that may be cured by light irradiation.

Further, the display device 100 may further include a touch screen panel, which may be located on the display panel 101. For example, the touch screen panel may be located between the display panel 101 and the polarizer 510.

Figure 2:
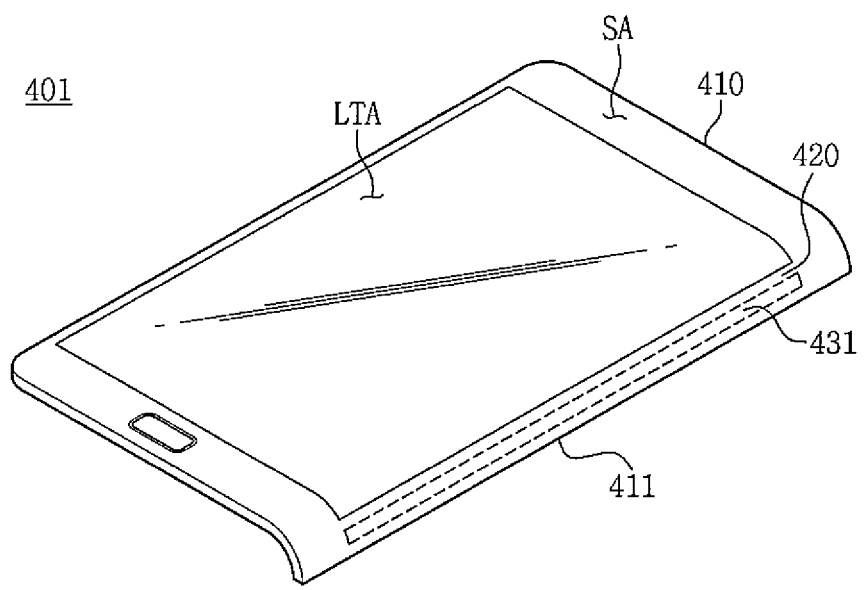
FIG. 2 is a perspective view illustrating a window of FIG. 1.
Figure 3:
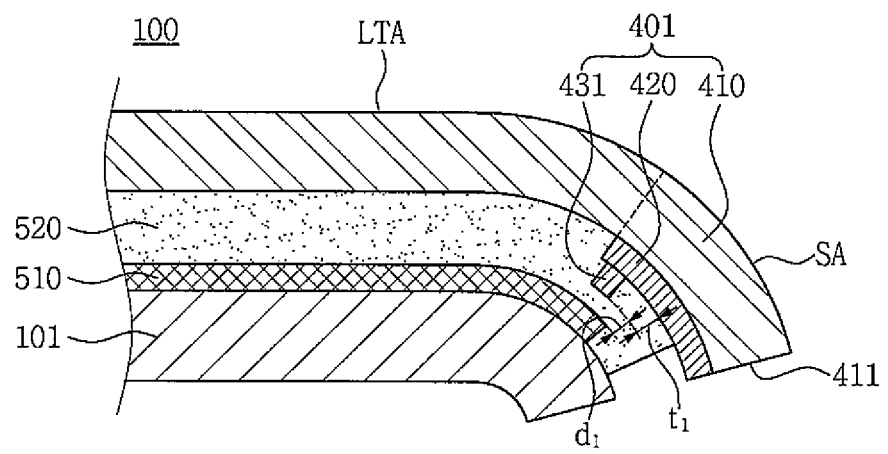
FIG. 3 is a cross-sectional view illustrating a curved edge portion of the display device according to the first exemplary embodiment.

FIG. 2 is a perspective view illustrating the window 401 of FIG. 1, and FIG. 3 is a cross-sectional view illustrating a curved edge portion of the display device 100 according to the first exemplary embodiment. In FIG. 3, the housing 310 and the shock absorbing sheet 320 are omitted.

The window 401 may include a window base 410 that is light transmissive (e.g., that has a light transmission property), a light shielding layer 420 located on at least one surface of the window base 410, and a protrusion 431 located on the light shielding layer 420.

The window base 410 may have a quadrangular plate shape, and a portion around or near an angular point of the plate may have a round shape. In addition, the window base 410 may have at least one curved edge portion. The window base 410 illustrated in FIGS. 2 and 3 may have a structure in which a right edge portion 411 is curved (e.g., with respect to a home button positioned at a lower portion of the window base 410).

The window base 410 may be formed of a shock-resistant material having a shock-resistance property, such as plastic or glass.

The window 401 may have a light transmission area LTA, which may allow light to be transmitted, and a light shielding area SA, which may shield light.

The light shielding area SA of the window 401 may correspond to a portion of the window base 410 on which the light shielding layer 420 is located, and the light transmission area LTA may correspond to a portion of the window base 410 on which the light shielding layer 420 is not located. The light shielding area SA may surround the light transmission area LTA, and light might not pass through the light shielding area SA. Accordingly, the light transmission area LTA may correspond to the display area DA of the display panel 101, and the light shielding area SA may correspond to the non-display area NDA of the display panel 101.

The light shielding layer 420 may be located on a surface of the window base 410 facing the display panel 101, and may be located adjacent an edge portion of the window base 410.

The polarizer 510 may be generally located on a lower portion of the window 401, and in when an end portion 511 (e.g., see FIGS. 4 and 5) of the polarizer 510 is noticed by a user, a screen may seem discontinuous, thus providing unfavorable visual sensation to the user. Accordingly, the end portion 511 of the polarizer 510 may be located below the light shielding area SA of the window 401 to prevent visibility of the end portion 511 of the polarizer 510 by the user. However, when an edge portion of the display device 100 is curved (e.g., the right edge portion 411), the end portion 511 of the polarizer 510 may be noticed through the curved edge portion.

Figure 4:
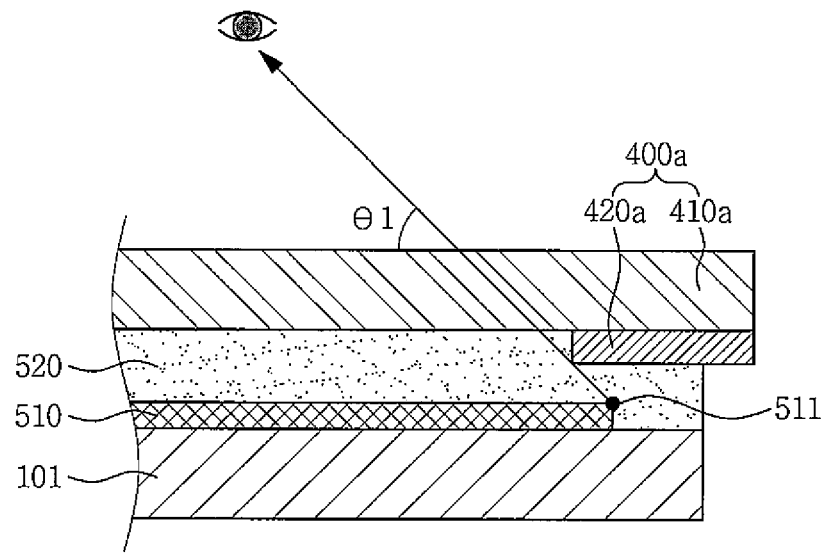
FIG. 4 is a cross-sectional view illustrating a flat edge portion of a display device.
Figure 5:
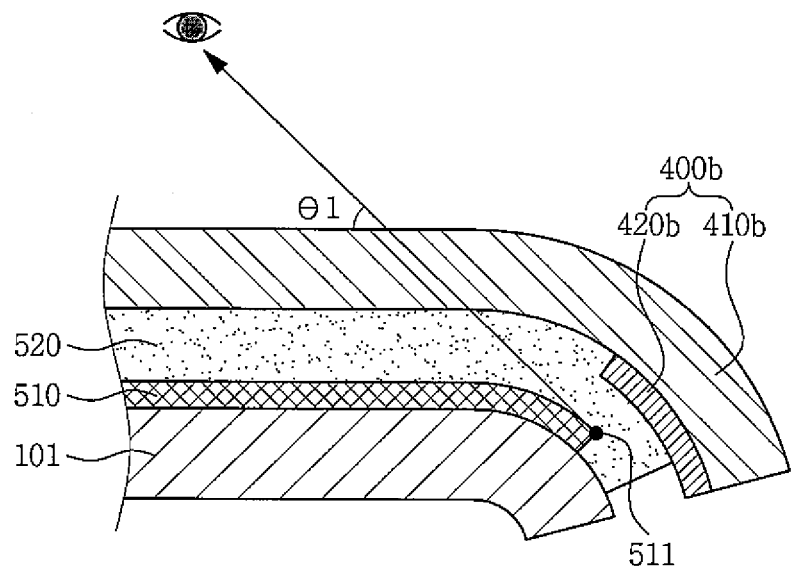
FIG. 5 is a cross-sectional view illustrating a curved edge portion of a display device.

FIG. 4 is a cross-sectional view illustrating a flat edge portion of a display device, and FIG. 5 is a cross-sectional view illustrating a curved edge portion of a display device. In FIGS. 4 and 5, a housing 310 and a shock absorbing sheet 320 are omitted.

A window 400a illustrated in FIG. 4 may include a window base 420a and a light shielding layer 420a, which have flat edge portions. Provided that the window 400a of FIG. 4 is applied to the display device 100, when an angle between a sight line of a user and a surface of the window 400a is less than an angle θ1, an end portion 511 of a polarizer 510 may be noticed/seen by the user, and when the angle is equal to or greater than the angle θ1, the end portion 511 of the polarizer 510 might be hidden from the user (e.g., hidden by the light shielding layer 420a).

Contrastingly, and referring to FIG. 5, when the window 400b has a curved edge portion and is applied to the display device 100, the end portion 511 of the polarizer 510 may be noticed by the user, even though an angle between the sight line of the user and the surface of the window 400b is equal to the angle θ1, or possibly even when the angle is more than the angle θ1.

In other words, although a user looks at an edge portion of a display device 100 at the same angle, when looking at the display device 100 of FIG. 4, the end portion 511 of the polarizer 510 might not be noticed by the user, and when looking at the display device of FIG. 5, the end portion 511 of the polarizer 510 may be noticed by the user.

To prevent visibility of the end portion 511 of the polarizer 510 from a user, according to the first exemplary embodiment, a protrusion 431 may be located on the light shielding layer 420 of the display device 100. The protrusion 431 may block the end portion 511 of the polarizer 510 from being noticed by the user.

For example, the protrusion 431 may be located on the light shielding layer 420, and may protrude/extend toward the polarizer 510. The protrusion 431 may be located inwardly of the end portion 511 of the polarizer 510, and may be spaced from the polarizer 510 to be located above the polarizer 510.

Referring to FIG. 2, the window base 410 may have the edge portion 411 that is curved, and the protrusion 431 may be located on a portion of the light shielding layer 420 positioned on the curved edge portion 411. Further, the protrusion 431 may be located in a line shape extending along the curved edge portion 411.

The protrusion 431 may have a polygonal or circular cross-section. According to the first exemplary embodiment, the protrusion 431 may have a quadrangular cross-section. A height t1 of the protrusion 431 may vary depending on a distance between the polarizer 510 and the window 401. The protrusion 431, for example, may have the height t1 in a range of about 10 micrometer (μm) to about 200 μm.

The protrusion 431 may be spaced (e.g., by a predetermined distance) from the polarizer 510.

To attach the window 401 to the display panel 101, the following processes may be performed: disposing/placing a photosensitive resin composition between the display panel 101 and the window 401, applying pressure to compress the display panel 101 and the window 401, and then curing the photosensitive resin composition. In the processes, to allow the photosensitive resin composition that is used to adhere the window 401 to easily flow, the protrusion 431 and the polarizer 510 may be spaced apart from each other.

A distance d between the protrusion 431 and the polarizer 510, for example, may be in a range of about 10 μm to about 200 μm. When the protrusion 431 and the polarizer 510 is spaced apart from each other by a distance in a range of about 10 μm to about 200 μm, visibility of the end portion 511 of the polarizer 510 may be prevented. Further, the photosensitive resin composition may readily flow to form the stable adhesion layer 520 between the display panel 101 and the window 401, and may flow without generating gas/bubbles.

The protrusion 431 may be made of the same material as that of the light shielding layer 420, or may alternatively be formed of a different material from thereto. Further, there is no particular limitation in a method of forming the protrusion 431.

As an example, a material for forming the light shielding layer 420 may be coated on the window base 410, and subsequently, selective light exposure may be performed using a pattern mask to thereby form the light shielding layer 420 and the protrusion 431 together.

As another example, the light shielding layer 420 may be formed, and then the protrusion 431 may be placed on the light shielding layer 420. For example, a tape having a given thickness and width may be located on the light shielding layer 420 to form the protrusion 431.

As for another example, the protrusion 431 may be located on a flat edge portion of the window base 410. When the protrusion 431 is located on the flat edge portion of the window base 410, a width of the light shielding layer 420, which is configured to prevent visibility of a structure (e.g., the end portion 511 of the polarizer 510) may be reduced, and the light shielding area SA may also be reduced. Accordingly, the display device 100 may have a narrow bezel, or may even have a structure with no bezel/substantially no bezel.

Hereinafter, a second exemplary embodiment will be described with reference to FIG. 6. To avoid repetition, configurations identical to the configurations described hereinabove will be omitted.

Figure 6:
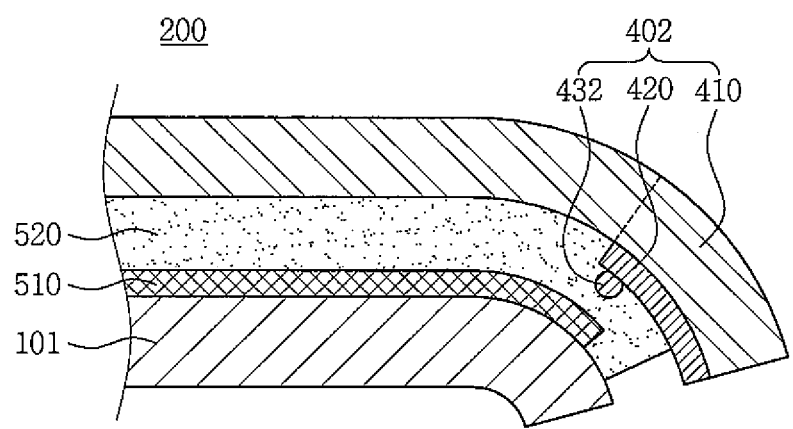
FIG. 6 is a cross-sectional view illustrating an edge portion of a display device according to a second exemplary embodiment.

FIG. 6 is a cross-sectional view illustrating an edge portion of a display device 200 according to the second exemplary embodiment.

The display device 200 according to the second exemplary embodiment may include a protrusion 432 having a circular cross-section, which may block visibility of an end portion 511 of a polarizer 510 by the user. Further, the protrusion 432 having a circular cross-section may be spaced from the polarizer 510, and thus a photosensitive resin composition may readily flow therebetween, and may serve as an adhesive in the process of adhering the display panel 101 to the window 401.

However, the second exemplary embodiment is not limited thereto, and the protrusion 432 may have a semicircular, an elliptical, or a semi-elliptical cross-section.

Hereinafter, a third exemplary embodiment will be described with reference to FIG. 7.

Figure 7:
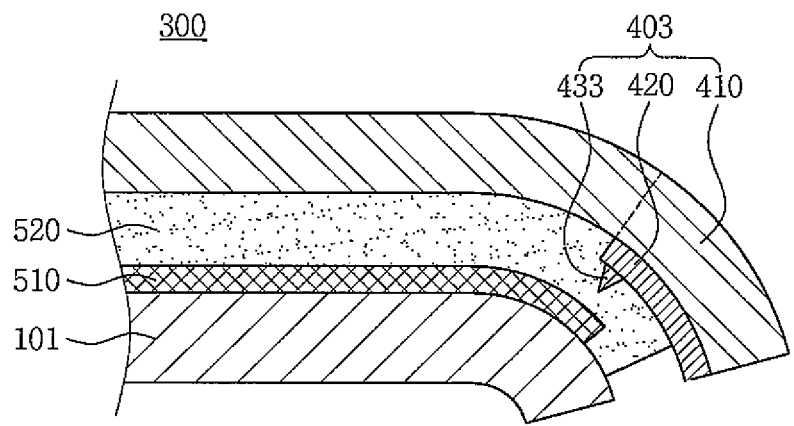
FIG. 7 is a cross-sectional view illustrating an edge portion of a display device according to a third exemplary embodiment.

FIG. 7 is a cross-sectional view illustrating an edge portion of a display device 300 according to the third exemplary embodiment. The display device 300 according to the third exemplary embodiment may include a protrusion 433 having a triangular cross-section.

Hereinafter, a fourth exemplary embodiment will be described with reference to FIG. 8.

Figure 8:
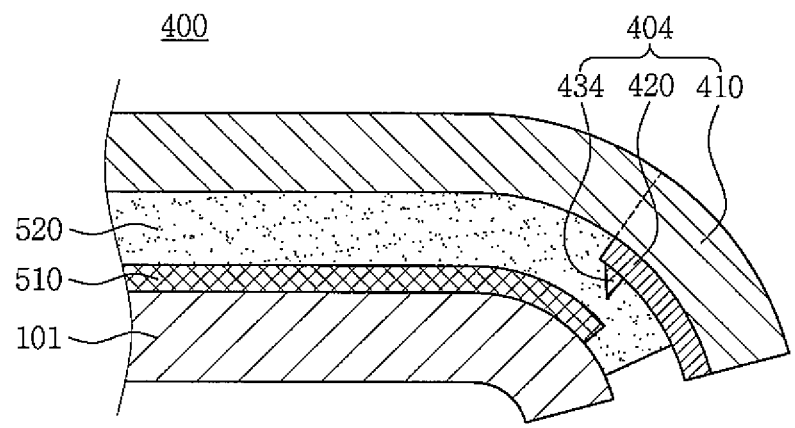
FIG. 8 is a cross-sectional view illustrating an edge portion of a display device according to a fourth exemplary embodiment.

FIG. 8 is a cross-sectional view illustrating an edge portion of a display device 400 according to the fourth exemplary embodiment. The display device 400 according to the fourth exemplary embodiment may include a protrusion 434 having a right-angled triangular cross-section.

Hereinafter, a fifth exemplary embodiment will be described with reference to FIG. 9.

Figure 9:
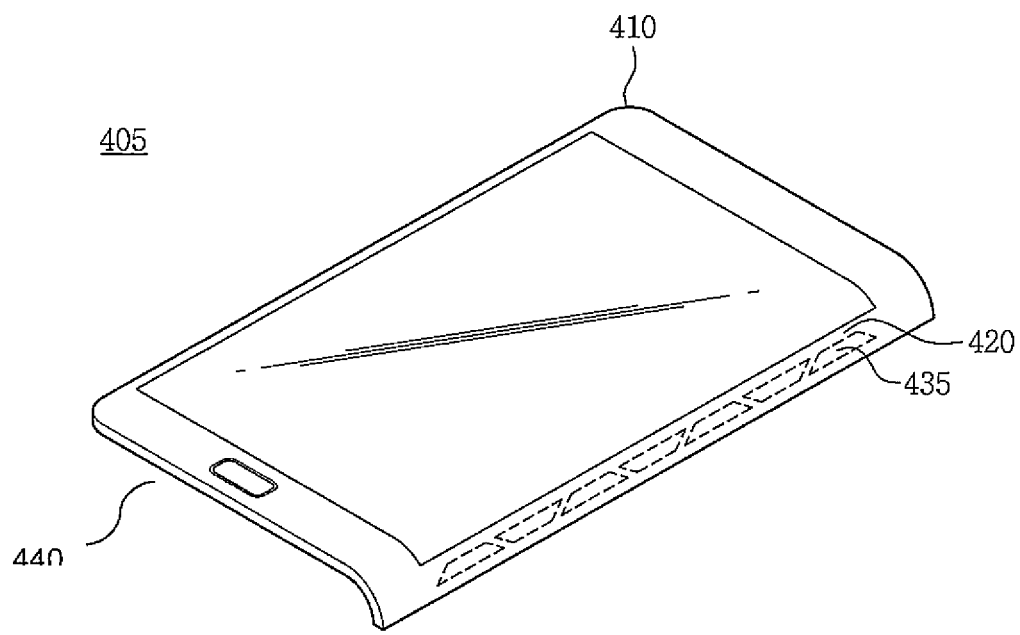
FIG. 9 is a perspective view illustrating a window according to a fifth exemplary embodiment.

FIG. 9 is a perspective view illustrating a window 405 according to the fifth exemplary embodiment. The window 405 according to the fifth exemplary embodiment may include a plurality of protrusions 435 arranged in an island shape. In detail, the plurality of protrusions 435 may be discontinuously located on a light shielding layer 420 along an edge portion of a window base 410. Each protrusion 435 may have a trapezoidal plane and a quadrangular cross-section.

Hereinafter, the display panel 101 used in the display device 100 according to the first exemplary embodiment will be described with reference to FIGS. 10 and 11. The display panel 101 of the display device 100 according to the first exemplary embodiment may be an organic light emitting display panel.

Figure 10:
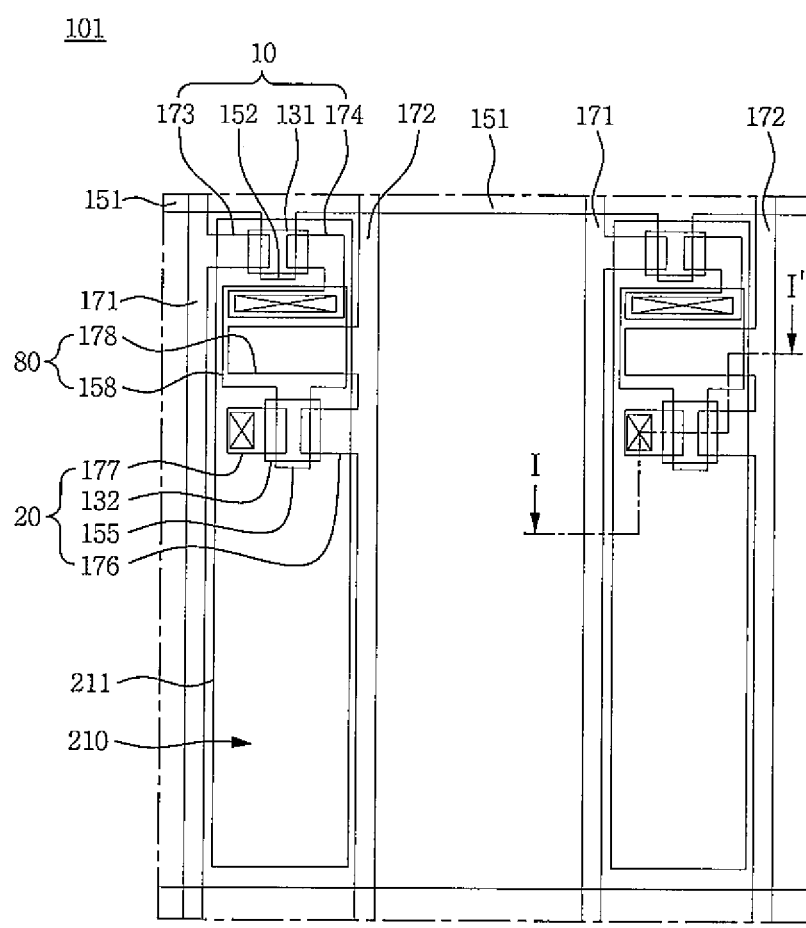
FIG. 10 is a plan view illustrating the portion "A" of FIG. 1.
Figure 11:
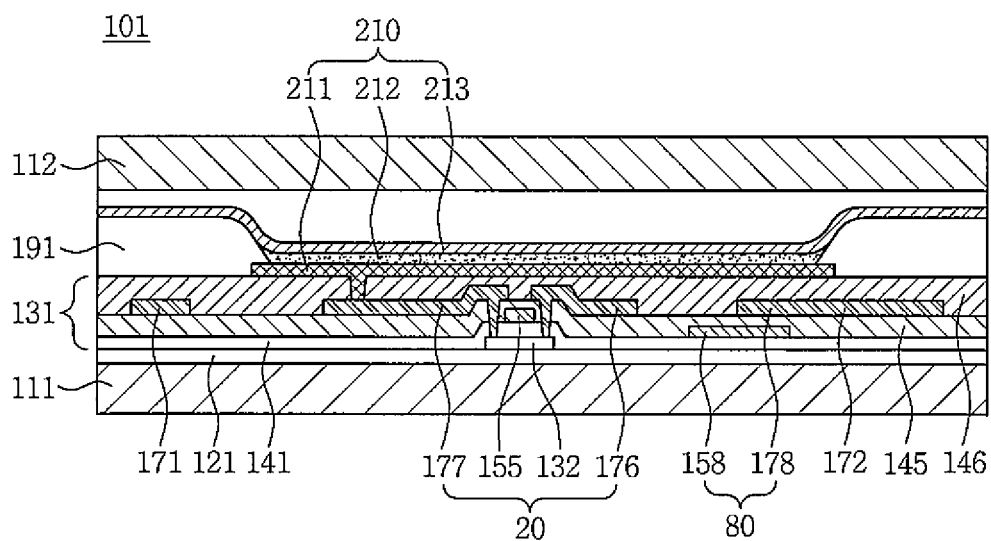
FIG. 11 is a cross-sectional view taken along the line I-I' of FIG. 10.

FIG. 10 is a plan view illustrating the display panel 101 of FIG. 1, and FIG. 11 is a cross-sectional view taken along the line I-I' of FIG. 10.

As illustrated in FIGS. 10 and 11, the display panel 101 may include a first substrate 111, a wiring unit 131, an organic light emitting diode ("OLED") 210, and a second substrate 112.

The first substrate 111 may be made of an insulating material, such as glass, quartz, ceramic, plastic and/or the like. Further, the first substrate 111 may be made of a metal material, such as stainless steel and the like.

A buffer layer 121 may be located on the first substrate 111. The buffer layer 121 may include one or more layers selected from a variety of inorganic layers and organic layers. The buffer layer 121 may reduce or prevent infiltration of moisture or undesired materials into the wiring unit 131 or the OLED 210, and may also planarize a surface of the first substrate 111. However, the buffer layer 121 may be omitted in other embodiments.

The wiring unit 131 may be located on the buffer layer 121. The wiring unit 131 may include a switching thin film transistor ("TFT") 10, a driving TFT 20, and a capacitor 80, and may drive the OLED 210. That is, the OLED 210 may display an image by emitting light according to a driving signal applied from the wiring unit 131.

FIGS. 10 and 11 illustrate an active matrix-type organic light emitting diode display panel (AMOLED display panel) 101 having a 2Tr-1 Cap structure. For example, the 2Tr-1 Cap structure may include the two TFTs (i.e., the switching TFT 10 and the driving TFT 20) and the capacitor 80 in one pixel. However, the display panel 101 according to the first exemplary embodiment is not limited thereto. In some embodiments, the OLED display panel 101 may have many different structures, such as including three or more TFTs and two or more capacitors in one pixel, and may further include additional wirings. As described herein, the term "pixel" refers to the smallest unit for displaying an image. The OLED display panel 101 may display an image using a plurality of pixels.

Each pixel may include the switching TFT 10, the driving TFT 20, the capacitor 80, and the OLED 210. The wiring unit 131 may include a gate line 151 arranged along a direction, and a data line 171 and a common power line 172 insulated from and crossing the gate line 151. The pixel may be defined by the gate line 151, the data line 171, and the common power line 172, but is not limited thereto. The pixel may also be defined by a black matrix or the pixel defining layer (PDL) 191.

The OLED 210 may include a first electrode 211, an organic light emitting layer 212 located on the first electrode 211, and a second electrode 213 located on the organic light emitting layer 212. In the OLED 210, holes and electrons are respectively injected from the first electrode 211 and the second electrode 213 into the organic light emitting layer 212. The hole and the electron are combined with each other to form an exciton, and the OLED may emit light by energy generated when the exciton falls from an excited state to a ground state.

The capacitor 80 may include a pair of capacitor plates 158 and 178 with an interlayer insulating layer 145 interposed therebetween. Herein, the interlayer insulating layer 145 may be a dielectric material. Capacitance of the capacitor 80 may be determined by electric charge(s) stored in the capacitor 80 and by voltage across the pair of capacitor plates 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177. In addition, the semiconductor layers 131 and 132 may be insulated from the gate electrodes 152 and 155 by the gate insulating layer 141.

The switching TFT 10 may function as a switching device that selects a pixel to perform light emission. The switching gate electrode 152 may be connected to the gate line 151. The switching source electrode 173 may be connected to the data line 171. The switching drain electrode 174 may be spaced from the switching source electrode 173, and may be connected to one of the capacitor plates 158.

The driving TFT 20 may apply a driving power to the first electrode 211, which serves as a pixel electrode, such that the organic light emitting layer 212 of the OLED 210 in a selected pixel may emit light. The driving gate electrode 155 may be connected to the capacitor plate 158 that is connected to the switching drain electrode 174. The driving source electrode 176 and the other of the capacitor plates 178 may each be connected to the common power line 172. The driving drain electrode 177 may be connected to the first electrode 211 of the OLED 210 through a contact hole.

With the above-described structure, the switching TFT 10 may be operated by a gate voltage applied to the gate line 151, and may function to transmit to the driving TFT 20 a data voltage applied to the data line 171. A voltage that is equivalent to a difference between a common voltage applied to the driving TFT 20 from the common power line 172, and the data voltage transmitted from the switching TFT 10, may be stored in the capacitor 80. Accordingly, current corresponding to the voltage stored in the capacitor 80 may flow to the OLED 210 through the driving TFT 20, such that the OLED 210 may emit light.

Herein, the first electrode 211 is an anode serving as a hole injection electrode, and the second electrode 213 is a cathode serving as an electron injection electrode. However, the first exemplary embodiment is not limited thereto. For example, the first electrode 211 may be a cathode electrode, and the second electrode 213 may be an anode electrode.

A planarization layer 146 may be located on the interlayer insulating layer 145, and may include insulating materials, and may protect the wiring unit 131. The planarization layer 146 and the interlayer insulating layer 145 may be made of the same material.

The drain electrode 177 of the driving TFT 20 may be connected to the first electrode 211 of the OLEO 210, through the contact hole formed in the planarization layer 146.

According to the first exemplary embodiment, the first electrode 211 may be formed as a reflective electrode, and the second electrode 213 may be formed as a transflective electrode. Accordingly, light generated from the organic light emitting layer 212 may be emitted through the second electrode 213. That is, the display device 100 according to the first exemplary embodiment may have a top-emission type structure.

One or more metal of magnesium (Mg), silver (Ag), gold (Au), calcium (Ca), lithium (Li), chromium (Cr), aluminum (Al), and/or copper (Cu), and/or a metal alloy thereof may be used to form the reflective electrode and the transflective electrode. In this regard, whether the electrode is a reflective type or a transflective type depends on the thickness. In general, the transflective electrode has a thickness less than or equal to about 200 nm. Transmittance of light may increase in accordance with a decrease in the thickness of the transflective electrode, and transmittance of light may decrease in accordance with an increase in the thickness thereof.

For example, the first electrode 211 may include a reflective layer including at least one metal of magnesium (Mg), silver (Ag), gold (Au), calcium (Ca), lithium (Li), chromium (Cr), aluminum (Al), and/or copper (Cu), and may include a transparent conductive layer located on the reflective layer. Herein, the transparent conductive layer may include a transparent conductive oxide (TCO), for example, at least one of indium tin oxide (ITO), indium zinc oxide (IZO), zinc oxide (ZnO), aluminum zinc oxide (AZO), and indium oxide ($In_2O_3$). Such transparent conductive layer may have a relatively high work function, thus allowing more active hole injection through the first electrode 211.

Further, the first electrode 211 may have a triple-layer structure including a transparent conductive layer, a reflective layer, and a transparent conductive layer that are sequentially laminated.

The second electrode 213 may be formed as a transflective layer including one or more metal of magnesium (Mg), silver (Ag), gold (Au), calcium (Ca), lithium (Li), chromium (Cr), aluminum (Al), and/or copper (Cu).

Although not illustrated, at least one of a hole injection layer ("HIL") and a hole transporting layer ("HTL") may be located between the first electrode 211 and the organic light emitting layer 212. In addition, at least one of an electron transporting layer ("ETL") and an electron injection layer ("EIL") may be located between the organic light emitting layer 212 and the second electrode 213.

The organic light emitting layer 212, the HIL, the HTL, the ETL, and the EIL may be collectively called an organic layer. The organic layer may be formed of a low molecular weight organic material, or a high molecular weight organic material.

The pixel defining layer 191 may have/define an aperture. The aperture of the pixel defining layer 191 may expose a portion of the first electrode 211. The first electrode 211, the organic light emitting layer 212, and the second electrode 213 may be sequentially laminated in the aperture of the pixel defining layer 191. Herein, the second electrode 213 may be formed on not only the organic light emitting layer 212, but also on the pixel defining layer 191. The OLED 210 may generate light by the organic light emitting layer 212 in the aperture of the pixel defining layer 191. Accordingly, the pixel defining layer 191 may define light emission areas.

Although not illustrated, a capping layer may be located on the second electrode 213, and may protect the OLED 210.

To protect the OLED 210, the second substrate 112 may be located on the OLED 210, and opposed to the first substrate 111. The second substrate 112 may include the same material as that of the first substrate 111.

Figure 12:
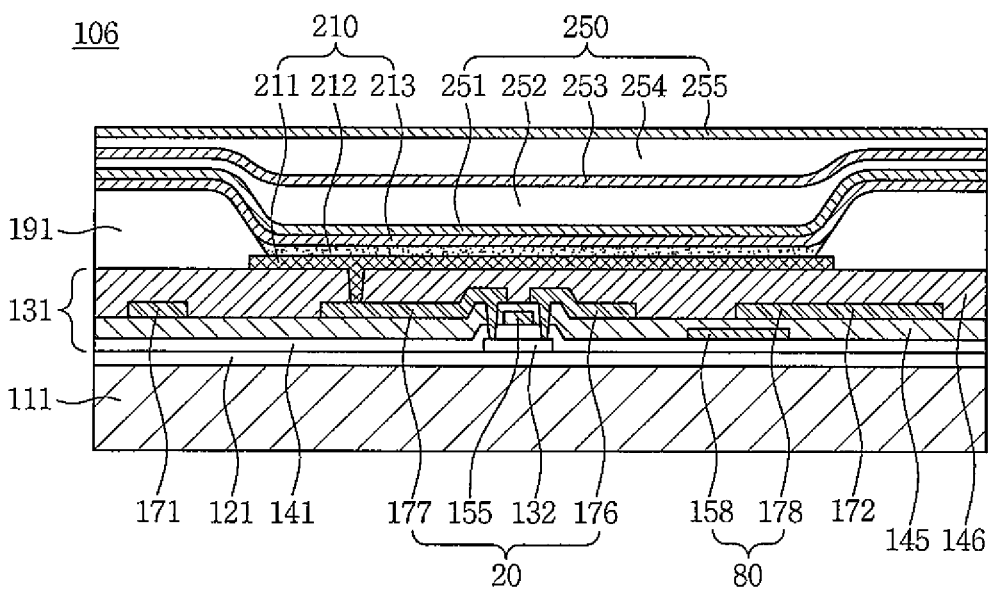
FIG. 12 is a cross-sectional view illustrating a display panel according to a sixth exemplary embodiment.

Hereinafter, an OLED display device 102 according to a sixth exemplary embodiment will be described with reference to FIG. 12. FIG. 12 is a cross-sectional view illustrating a display panel 106 according to the sixth exemplary embodiment.

The display panel 106 according to the sixth exemplary embodiment may correspond to an organic light emitting display panel, and may include a thin film encapsulation layer 250 located on an OLED 210.

The thin film encapsulation layer 250 may include one or more inorganic layers 251, 253, and 255, and one or more organic layers 252 and 254. The thin film encapsulation layer 250 may have a structure in which the inorganic layers 251, 253, and 255 and the organic layers 252 and 254 are alternately laminated. In this regard, the bottom inorganic layer 251 may be located at a bottommost portion (e.g., may be located the most closely to the OLED 210). Although the thin film encapsulation layer 250, illustrated in FIG. 12, includes three inorganic layers 251, 253, and 255, and two organic layers 252 and 254, the sixth exemplary embodiment is not limited thereto.

The inorganic layers 251, 253, and 255 may include one or more inorganic materials of $Al_2O_3$, $TiO_2$, $ZrO$, $SiO_2$, AlON, AlN, SiON, $Si_3N_4$, ZnO, and/or $Ta_2O_5$. The inorganic layers 251, 253, and 255 may be formed through methods such as chemical vapor deposition (CVD) or atomic layer deposition (ALD). However, the sixth exemplary embodiment is not limited thereto, and the inorganic layers 251, 253, and 255 may be formed employing various methods known to those skilled in the art.

The organic layers 252 and 254 may include polymer-based materials. Herein, examples of the polymer-based material may include an acrylic resin, an epoxy resin, polyimide, and/or polyethylene. The organic layers 252 and 254 may be formed through a thermal deposition process, which may be performed in a range of temperatures that may not damage the OLED 210. However, the sixth exemplary embodiment is not limited thereto, and the organic layers 252 and 254 may be formed employing various methods known to those skilled in the pertinent art.

The inorganic layers 251, 253, and 255 having a high density of thin films may prevent or efficiently reduce infiltration of moisture or oxygen into the OLED 210.

Moisture and oxygen that pass through the inorganic layers 251, 253, and 255 may be blocked by the organic layers 252 and 254. The organic layers 252 and 254 may exhibit a relatively low moisture-infiltration preventing efficacy when compared to the inorganic layers 251, 253, and 255. However, in addition to the function of preventing moisture infiltration, the organic layers 252 and 254 may also serve as a buffer layer to reduce stress between respective layers of the inorganic layers 251, 253, and 255 and the organic layers 252 and 254. Further, since the organic layers 252 and 254 have planarization properties, the uppermost surface of the thin film encapsulation layer 250 may be planarized.

The thin film encapsulation layer 250 may be formed to have a thickness of about 10 μm or less. Accordingly, the OLED display device 102 may be formed to have an overall thickness significantly small.

When the thin film encapsulation layer 250 is located on the OLED 210, the second substrate 112 may be omitted. When the second substrate 112 is omitted, flexibility of the OLED display panel 106 may be enhanced.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings.

What is claimed is:

1. A display device comprising:
   a display panel;
   a polarizer on the display panel;
   an adhesion layer on the polarizer; and
   a window on the adhesion layer, the window comprising:
   a light transmissive window base having a curved edge portion;
   a curved light shielding layer on the curved edge portion; and
   a protrusion on the curved light shielding layer located inwardly of an end portion of the polarizer,
   wherein the polarizer has a flat portion, and a curved portion corresponding to the curved edge portion of the window base,
   wherein the protrusion is disposed between the curved portion of the polarizer and the curved light shielding layer,
   wherein the end portion of the polarizer is located inwardly of an end portion of the curved light shielding layer, and
   wherein the adhesion layer covers a bottom and side surfaces of the protrusion and a top and at least one side surface of the polarizer to hermetically seal the protrusion and the polarizer.

2. The display device of claim 1, wherein the curved light shielding layer is on a surface of the window base facing the display panel.

3. The display device of claim 1, wherein the protrusion extends toward the polarizer.

4. The display device of claim 1, wherein the protrusion has a height in a range of about 10 μm to about 200 μm.

5. The display device of claim 1, wherein the protrusion is spaced from the polarizer.

6. The display device of claim 5, wherein a distance between the protrusion and the polarizer is in a range of about 10 μm to about 200 μm.

7. The display device of claim 1, wherein the protrusion has a polygonal, a circular, a semi-circular, an elliptical, or a semi-elliptical cross-section.

8. The display device of claim 1, wherein the protrusion extends along the curved edge portion.

9. The display device of claim 1, wherein the display panel comprises:
   a first substrate;
   a first electrode on the first substrate;
   an organic light emitting layer on the first electrode; and
   a second electrode on the organic light emitting layer.

10. The display device of claim 9, wherein the display panel comprises a second substrate on the second electrode.

11. The display device of claim 9, wherein the display panel comprises a thin film encapsulation layer on the second electrode.

* * * * *